United States Patent
Fu et al.

(10) Patent No.: US 7,602,471 B2
(45) Date of Patent: Oct. 13, 2009

(54) APPARATUS AND METHOD FOR PARTICLE MONITORING IN IMMERSION LITHOGRAPHY

(75) Inventors: Tzung Chi Fu, Maioli (TW); Shu-Ping Hsu, Kaohsiung (TW); Hsiu-Yu Chang, Tuku Township, Yunlin County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 324 days.

(21) Appl. No.: 11/383,912

(22) Filed: May 17, 2006

(65) Prior Publication Data

US 2007/0268469 A1    Nov. 22, 2007

(51) Int. Cl.
*G03B 27/52* (2006.01)
*G03B 27/42* (2006.01)

(52) U.S. Cl. ........................................ 355/30
(58) Field of Classification Search .............. 355/30, 355/53, 55, 67, 77; 250/548
See application file for complete search history.

(56) References Cited

U.S. PATENT DOCUMENTS

| | | | | |
|---|---|---|---|---|
| 5,610,683 A | * | 3/1997 | Takahashi | 355/53 |
| 7,317,504 B2 | * | 1/2008 | De Smit et al. | 355/30 |
| 2006/0050351 A1 | * | 3/2006 | Higashiki | 359/228 |
| 2007/0252960 A1 | * | 11/2007 | Kida | 355/30 |
| 2007/0291239 A1 | * | 12/2007 | Shiraishi | 355/30 |

FOREIGN PATENT DOCUMENTS

WO    WO 2005/122218 A1  *  12/2005

* cited by examiner

*Primary Examiner*—Hung Henry Nguyen
(74) *Attorney, Agent, or Firm*—Haynes and Boone, LLP

(57) ABSTRACT

The present disclosure provides an immersion lithography system. The system includes an imaging lens having a front surface; a substrate stage positioned underlying the front surface of the imaging lens; an immersion fluid retaining structure having a fluid inlet and a fluid outlet, configured to hold a fluid from the fluid inlet, at least partially filling a space between the front surface and a substrate on the substrate stage, and flowing the fluid out through the fluid outlet; and a particle monitor module integrated with the immersion fluid retaining structure.

20 Claims, 3 Drawing Sheets

APPARATUS AND METHOD FOR PARTICLE MONITORING IN IMMERSION LITHOGRAPHY

BACKGROUND

Immersion lithography typically involves exposing a coated resist to a pattern through a de-ionized water (DIW) filled in the space between a project lens and the resist layer for higher resolution. Current immersion lithography processes may include various processing steps such as resist coating, pre-baking, immersion exposing, post-exposure baking, developing, and hard baking. However, the current immersion lithography processes experience various contaminations and particle defects from wafers and components of the lithography system, resulting in pattern defects, pattern distortion, and pattern loss. It is also a challenge to effectively and efficiently monitor particles during an immersion lithography process.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
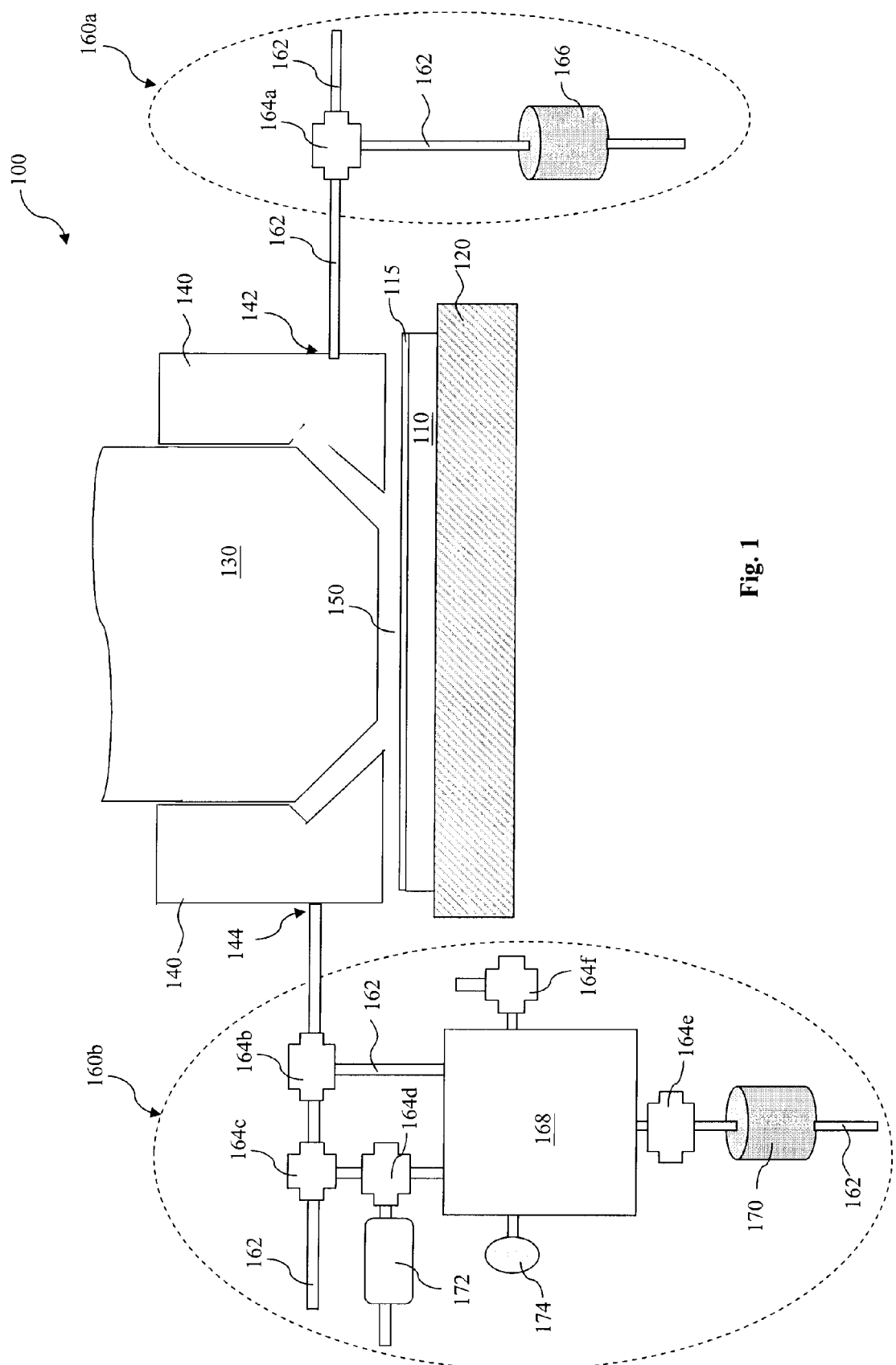
FIG. 1 is a schematic view of an embodiment of an immersion lithography apparatus with a mechanism of particle monitoring.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, which does not by itself indicate a requirement that features of one embodiment apply to another embodiment, even if they share the same reference number.

Referring to FIG. 1, illustrated is a schematic view of an embodiment of an immersion lithography apparatus 100 in which a substrate 110 is undergoing immersion lithography processing. The substrate 110 may be a semiconductor wafer having an elementary semiconductor, a compound semiconductor, an alloy semiconductor, or combinations thereof. The substrate may include one or more material layers such as poly-silicon, metal, and/or dielectric, to be patterned. The substrate may include other materials such as a glass substrate used for thin film transistor liquid crystal display (TFT-LCD) devices, or fused quartz substrate for mask. The substrate 110 may further include a patterning layer 115 formed thereon. The patterning layer 115 can be a photoresist (resist) layer that is responsive to an exposure process for creating patterns.

The apparatus 100 includes a substrate stage 120 to hold the substrate 110. Substrate stage 120 is operable to secure and move the substrate 110. For example, the stage 120 may be designed to be capable of translational and/or rotational displacement for wafer alignment, stepping, and scanning. The stage 120 provides movement relative to a lens system, radiation source, and/or photomask of the immersion lithography apparatus 100, as discussed below.

The immersion lithography apparatus 100 includes an imaging lens system (or a lens system) 130. The substrate 110 may be positioned on a stage 120 under the lens system 130. The lens system 130 may further include or be integral to an illumination system (e.g., the condenser) which may have a single lens or multiple lenses and/or other lens components. For example, the illumination system may include microlens arrays, shadow masks, and/or other structures. The lens system 130 may further include an objective lens which may have a single lens element or a plurality of lens elements. Each lens element includes a transparent substrate and may further include a plurality of coating layers. The transparent substrate may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. Typically the numerical aperture (NA) of the lens system 130 is more than about 0.8.

The apparatus 100 includes an immersion fluid retaining module 140 for holding an immersion fluid 150 having refractive index greater than 1, such as ultra pure water (UPW), de-ionized water (DIW), ion-doped water, optical transparent liquid, or other suitable fluids. The immersion fluid may include dissolved gas (such as CO2) and other soluble materials. The immersion fluid retaining module 140 may be positioned proximate (such as around) the lens system 130 and designed for other functions, in addition to holding the immersion fluid. The immersion fluid 150 flows in an inlet 142, fills into a space between the substrate 110 and the lens system, and flows out of an outlet 144. The immersion fluid retaining module 140 and the lens system 130 make up an immersion head.

The immersion fluid retaining module 140 may include various apertures for providing immersion fluid, providing other fluids, and/or performing other proper functions such as horizontal, vertical, and tilt movement.

The apparatus 100 may further include a radiation source (not shown) for providing radiation energy for patterning the patterning layer 115 of the substrate 110 during an immersion lithography patterning process. The radiation source may be a suitable ultraviolet (UV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm).

A photomask (also referred to as a mask or a reticle) may be introduced between the lens system 130 and the patterning layer 115 during an immersion lithography process. The mask includes a transparent substrate and a patterned absorption layer. The transparent substrate may use fused silica (SiO$_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when hitting on an absorption region. The absorption layer may be patterned to have one or more openings through which a light beam may travel without being absorbed by the absorption layer.

The apparatus 100 further includes or is integrated with a particle monitor module 160 designed and configured to monitor particles in the immersion fluid 150. In the present embodiment, the particle monitor module 160 includes an upstream particle monitor portion 160a configured to monitor particles in the immersion fluid before flowing into the inlet 142. The particle monitor portion 160a is to monitor particle count in immersion fluid before wafer exposure. The fluid used for analyzing particles is the same source as used in immersion exposure. The source immersion fluid is split into two flows, one is for immersion exposure and the other is for particle monitor and analysis. The particle monitor module 160 includes a downstream particle monitor portion 160b configured to monitor particles in the immersion fluid after flowing out of the outlet 144. The particle monitor module 160 includes a plurality of pipes 162 configured to connect various parts, and a plurality of valves 164a-164f, being manually or automatically switched on and off, configured to control various fluid transportations among the various parts for particle monitoring, which will be described in more details below. Analyzing of particle count may be in-line or off-line. Upstream site in-line analyzing is a real-time analyzing and can monitor quality of immersion fluid used in exposure for each semiconductor wafer. Downstream site analyzing can monitor particles generated during exposure. During exposure, particles or contaminates may be generated from photo resist or thin film over substrate.

For the upstream particle monitor portion 160a, a first liquid particle counter 166 is connected to the immersion fluid before flowing into the inlet 142 through the valve 164a. A liquid particle counter provides a mechanism of measuring particles in fluid. A liquid particle counter may utilize an optical mechanism for counting and determining particle size in liquid based on light scattering. In a liquid particle counter, laser light may be focused on a sample cell, through which a liquid is flowing. Light scattering occurs when a particle crosses the laser beam. Particle counters use optics to collect scattered light and to focus the light onto a photodetector. The photodetector then converts the scattered light into a voltage pulse whose amplitude reflects the size of the particle. During an immersion lithography process, a fraction of the immersion fluid supplied from an immersion fluid source flows through the liquid particle counter 166 and is detected for particles thereby.

The downstream particle monitor portion 160b monitors the downstream particles using a tank 168 and a second liquid particle counter 170. The tank 168 may be connected to the immersion fluid flowing out from the outlet 144 through one or more valves such as the valve 164b and/or the valve 164c. The tank 168 is designed to have a certain volume to hold the immersion fluid for testing by the second liquid particle counter 170. For example, the tank 168 may have a volume ranging between about 200 cc and 600 cc. The tank 168 may be made with a material compatible with the immersion fluid 150 and have a proper mechanical strength to withstand a pressure from the inside or the outside. In one embodiment, the tank 168 may include Polytetrafluorethylene (PTFE or Teflon), quartz, glass, or other suitable material. Alternatively, the tank 168 may have a structure utilized both PTFE and a metal material. For example, the tank 168 may be made of a PTFE lining reinforced with a metal frame.

The second liquid particle counter 170 is further connected to the tank 168 through the valve 164e. The second liquid particle counter 170 may be substantially similar to the first liquid particle counter 166.

The downstream particle monitor portion 160b may further include a gas filter 172 connected to the tank 168 through the valve 164d in a configuration capable of and controllable to provide a proper gas to the tank 168. The gas filter 172 can be any gas filter suitable to use in semiconductor manufacturing. The gas to the tank needs to be contamination free without introducing extra particles into the immersion fluid in the tank 168. The gas is also required to be compatible with the immersion fluid without chemical interaction. The gas may be compressive dry air (CDA), nitrogen, other inert gas, or other suitable gas.

The downstream particle monitor portion 160b may further include the valve 164f properly connected to the tank 168 to provide an exit to the gas filled therein. The downstream particle monitor portion 160b may also include a gas pressure gauge 174 coupled to the tank 168 to monitor the pressure therein. The gauge 174 or an additional gauge may be coupled between the gas valve 164d and the gas filter 172 for pressure monitoring. The downstream particle monitor portion 160b may configured differently to implement the tank 168 and the second liquid particle counter 170 for functional particle monitoring without the departure of the scope the present disclosure.

Figure 2:
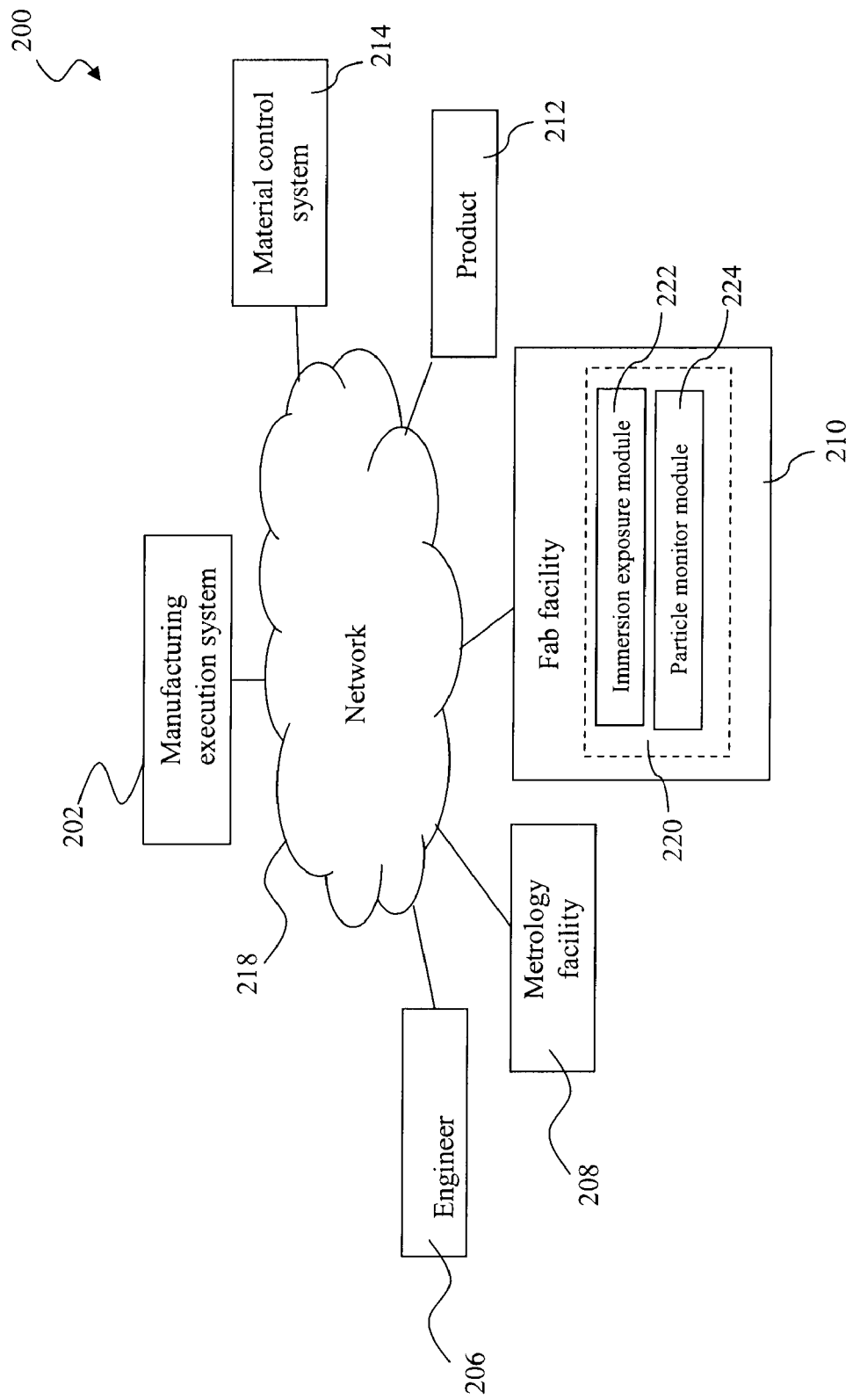
FIG. 2 is a block diagram of one embodiment of a manufacturing system within which the system of FIG. 1 may be utilized.

The apparatus 100 may further include a control module coupled to or integrated with host software of the apparatus 100 to control particle monitor processing, as further illustrated in FIG. 2. The apparatus 100 is capable to both perform immersion lithography processing and particle monitoring.

FIG. 2 illustrates a block diagram of one embodiment of an integrated manufacturing system 200 within which the apparatus 100 may be utilized. The system 200 includes a plurality of entities 202, 204, 206, 208, 210, 212, and 214 that are connected by a communications network 218. The network 218 may be a single network, or may be a variety of different networks, such as an intranet and the Internet.

In the present example, the entity 202 represents a manufacturing execution system, the entity 206 represents an engineer, the entity 208 represents a metrology facility for IC testing and measurement, the entity 210 represents a fabrication (fab) facility, the entity 212 represents a product, and the entity 214 represents a material control system. Each entity may interact with other entities, and may provide control and services to and/or receive command and services from the other entities.

The system 200 enables interaction among the entities 202-214 for the purpose of IC manufacturing. In the present example, IC manufacturing includes receiving an IC order and the associated operations needed to produce the ordered ICs, such as patterning a wafer using an immersion lithography method, monitoring particles and contaminations in an immersion fluid utilized by the immersion lithography method, and analyzing particle result for proper distribution, warning message, and corrective action. The fab facility includes an immersion lithography tool 220 having an immersion exposure module 222 and a particle monitor module 224. The tool 220 may be substantially similar to the apparatus 100. The immersion exposure module 222 and the particle monitor module 224 are controlled by a controller coupled to or integral to the system 200 such as being partially integrated with a host system of the immersion lithography tool 220 and partially integrated with the manufacturing execution system 202.

The system 200 may enable collaboration and information access in such areas as design, engineering, logistics, and material control. For example, the engineer 206 may collaborate with other engineers using fabrication information regarding fabrication control, product status, testing results, order handling, and particle monitoring. In another example, the contamination information with respect to the immersion lithography process is collected, analyzed, distributed, and shared among various the entities through the system 200. It is understood that these areas are exemplary, and that more or less information may be made available via the system 200, as desired.

Figure 3:
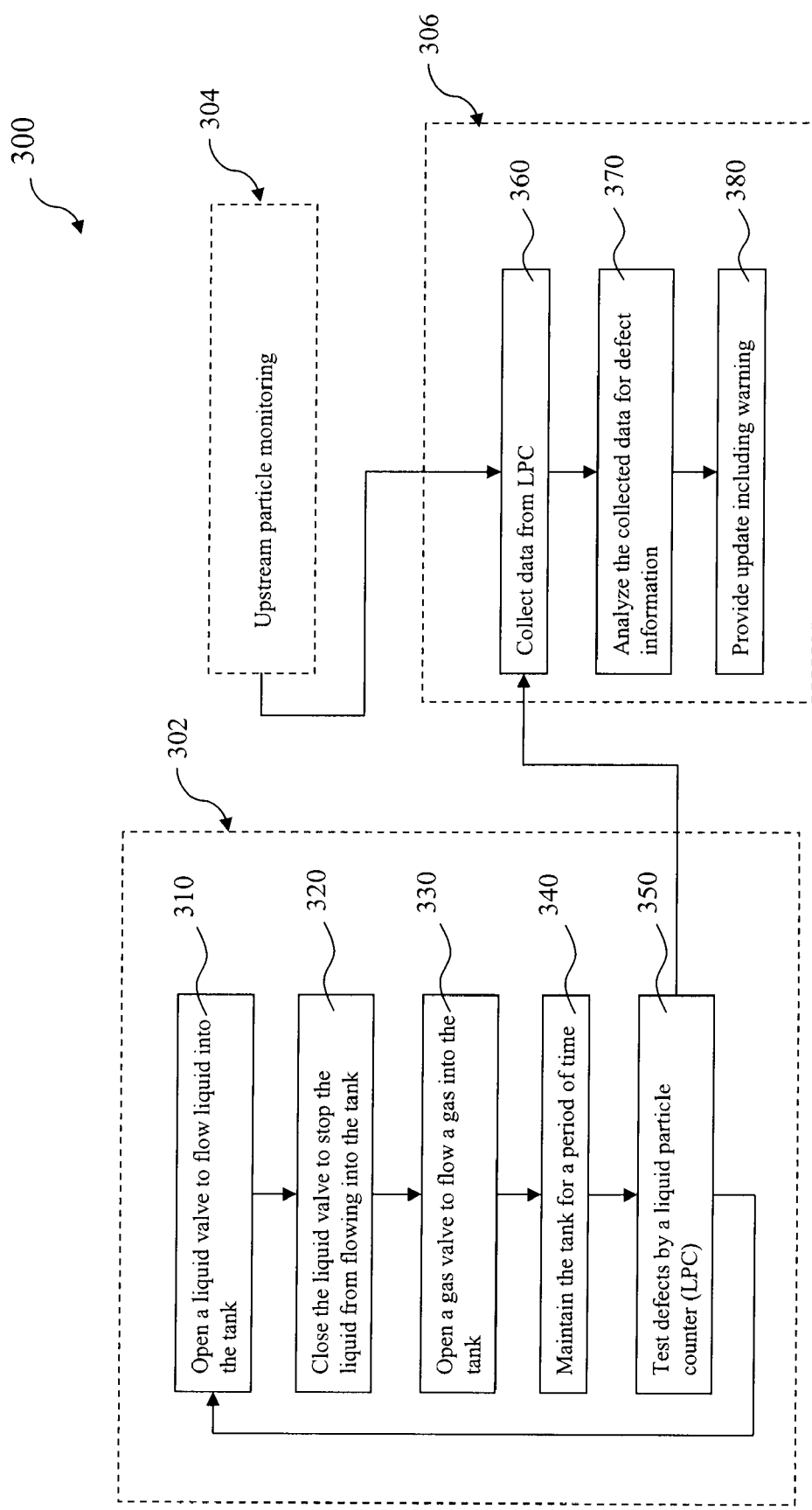
FIG. 3 is a flow chart of an embodiment of a method for implementing the apparatus of FIG. 1 for particle monitoring during an immersion lithography process.

FIG. 3 illustrates a flow chart of an embodiment of an immersion lithography method 300 to monitor particles in the immersion fluid. The method 300 may utilize the immersion lithography apparatus 100 and/or manufacturing system 200. The method 300 is described below with reference to FIGS. 1~3. The method 300 may be implemented during an immersion lithography patterning process, in which the immersion fluid 150 and a substrate such as a semiconductor wafer are involved.

The method 300 includes a process 302 to monitor downstream particles, a process 304 to monitor upstream particles, and a process 306 to handle particle data. The three processes 302, 304, and 306 may be implemented in parallel, sequentially, or other proper procedures.

The process 302 begins at step 310 by opening one or more valves coupled between the tank 168 and the outlet 144 such as the valve 164b and/or the valve 164c for filling the tank 168 with the immersion fluid 150 flowed out of the outlet 144. During the filling of the tank 168 with the immersion fluid, the valve 164e between the tank 168 and the second liquid particle counter 170 remains closed. The valve 164d between the tank 168 and the filter 172 may remain closed as well. The valve 164f may be open such that the existing gas in the tank may exit from the tank during the tank filling. Two valves such as 164b and 164c may be utilized to realize a stable flowing of the immersion fluid.

The process 302 proceeds to step 320 by closing the valve(s) between the tank 168 and the outlet 144 when the tank has been substantially filled or filled to a certain percentage of the tank volume. For example, the valves 164b and 164c will be closed when the tank 168 has been substantially filled.

The process 302 proceeds to step 330 by opening the valve 164d between the tank 168 and the filter 172 and filling the tank 168 with the filtered gas. The valve 164f may be controlled to be partially closed or completely closed at step 330. By flowing the filtered gas into the tank, a positive pressure can be built up in the tank 168, ensuring smoothly flowing of the immersion fluid through the second liquid particle counter 170 at a later step.

The process 302 proceeds to step 340 by maintaining the tank 168 for a period of time. The maintaining time may range from about a few minutes to hours. The maintaining process serves at least to stabilize the immersion fluid in the tank 168 and eliminate gas bubbles therein. During the maintaining time, various valves including the valves 164b~164f may be closed. Alternatively, the steps 330 and 340 may be implemented concurrently. For example, the immersion fluid in the tank may be maintained for a period of time while the valve 164d and 164f are open for maintaining proper pressure inside the tank. Or, the valve 164d remains open for compensating pressure loss in the tank during the maintaining time.

The process 302 proceeds to step 350 by opening the valve 164e and testing the immersion fluid in the tank 168 for particle information. During the testing of the immersion fluid for particles at step 350, the valve 164e between the tank 168 and the second liquid particle counter 170 remains open. The immersion fluid in the tank 168 flows through the second liquid particle counter 170, with a flow rate ranging between about 5 cc/min and 20 cc/min in one example. The valve 172 may be open as well to maintain proper pressure in the tank 168 and ensure proper flowing of the immersion fluid through the liquid particle counter 170. The particles in the immersion fluid flowing through the second liquid particle counter 170 will be detected thereby. Thus, the number of particles will be recorded. Particle size may also be recorded such that a distribution of number of particles vs. particle size can be extracted for further analysis, storing, and distribution.

The process 302 may further include a purging step to clean the tank utilizing a fluid such as the filtered gas from the valve 164d or the immersion fluid from the immersion fluid source.

The steps from 310 to 350 provide one embodiment of the process 302 to monitor downstream particles in the immersion fluid by utilizing the apparatus 100 having a tank and a liquid particle counter integrated. The process 302 may repeat the steps from 310 to 350 for testing the immersion fluid in more cycles with predefined intervals or at other requests.

The upstream particle monitoring process 304 may be implemented in a continuous mode and simultaneously with the downstream particle monitoring process 302. In one embodiment, the valve 164a between the first liquid particle counter 166 and the inlet 142 is opened initially and remains open. While the immersion fluid from an immersion fluid source flows into the inlet 142 for immersion lithography processing, a fraction of the immersion fluid from the source flows into the first liquid particle counter 166 for particle monitoring. The upstream particle monitoring is a continuous process and operable to start and stop by the apparatus 100. The process 304 can include one or more of the same process steps as process 302.

The process 306 initiates at step 360 by collecting data from various liquid particle counters such as the first and second liquid particle counters 166 and 168. The collected particle data may be saved in a database for further analysis and future uses. The collecting of data may be optimized to collect data from the middle flowing in one cycle for the downstream particle monitoring and avoid the initial and end flowing in order to eliminate instability, gas bubbles, and other side effects.

The process 306 proceeds to step 370 by analyzing the collected data for particle information such as comparison between the upstream particles and the downstream particles, contamination trend, and contamination level.

The process 306 proceeds to step 380 by providing the analyzed result to relevant engineers and the database through various methods such as an email, a wire phone, a wireless phone, a pager, the Internet, and/or other suitable media. The process 306 may also include providing a warning signal to the relevant engineers when the particles in the immersion fluid are abnormal such as out of limit, an increasing trend, and/or other issues. The process 306 may be implemented by a controller integrated with the apparatus 100 and/or system 200.

In addition to the processes 302, 304, and 306, the method 300 may also include an immersion lithography patterning process in which the substrate is exposed utilizing an immersion lithography technology. As one exemplary embodiment, the immersion lithography patterning process may include providing a semiconductor wafer or other suitable substrate with a resist layer formed thereon. The resist layer may comprise a suitable resist material such as a chemical amplifier (CA) resist material.

The immersion lithography patterning process may include filling the immersion fluid into the space between the lens system 130 and the resist layer 115 on the substrate 110. The immersion fluid may be UPW and supplied via the inlet 142. The immersion fluid 150 may only partially fill the space between the lens system 130 and the substrate 110. For example, the space under an illumination spot may be filled. The filled immersion fluid may move along with the illumination spot. The immersion fluid may continuously flow from the inlet 142, through the space between the lens system 130 and the resist layer 115, and to the outlet 144.

The immersion lithography patterning process may include exposing the resist layer 115. The resist layer 115 is illuminated with the radiation energy from the radiation source through the lens system, a patterned mask, and the immersion fluid filled in the space between the lens system and the substrate. The wafer is exposed to the radiation energy for a predetermined period of time with respect to the exposure dose and the intensity of the radiation source. Other processing steps may be integral to the immersion lithography patterning process. During the immersion lithography patterning process, the immersion fluid is monitored in situ for particles, thus a particle issue can be captured and corrected on time with minimized manufacturing loss. For example, when the immersion fluid source is contaminated, both the upstream and downstream particle levels will be high or has an increasing trend. The method 300 can catch the issue and notice the relevant engineers. The corrective action will follow such as stopping the immersion lithography patterning process until the immersion fluid source is recovered. In another example, when the apparatus 100, the substrate 110 (as a working piece), and/or environment have been contaminated, the downstream particle level will be higher or has an increasing trend. The contamination issue will be caught online and the relevant engineers will be notified thereof, followed by proper corrective actions.

The present disclosure may have many variations. The provided configurations of the apparatus 100 are only for illustration. For example, various pipes 162 and valves 164 may be connected differently with similar functionality. More or less pipes and valves may be added and avoided without destroying the intended functions. The method 300 and the processes 302~306 can also be varied or extended to achieve the purpose of particle monitoring with various flexibility, efficiency, cost, and performance. For example, the upstream particle monitoring process 304 may be triggered only when the downstream particle data are abnormal. The upstream particle monitoring may also utilize a structure having both a tank and a liquid particle counter integrated and implement a process similar to the process 302. In another alternation, a downstream particle monitoring process may realize a continuous monitoring process using the tank and the second liquid particle counter 170 wherein the tank serves as an volume to hold extra immersion fluid and delay the immersion fluid flowing from the outlet 144 to the second liquid particle counter 170 for a period time, relating to the volume of the tank, to stabilize the immersion fluid and eliminate gas bubbles before flowing through the second liquid particle counter 170.

Thus, the present disclosure provides an immersion lithography system. The system include an imaging lens having a front surface; a substrate stage positioned underlying the front surface of the imaging lens; an immersion fluid retaining structure having a fluid inlet and a fluid outlet, configured to hold a fluid from the fluid inlet, at least partially filling a space between the front surface and a substrate on the substrate stage, and flowing the fluid out through the fluid outlet; and a particle monitor module integrated with the immersion fluid retaining structure.

In this disclosed system, the particle monitoring module may include a tank coupled to the fluid outlet for taking the fluid and a first liquid particle counter (LPC) coupled to the tank for monitoring particles in the fluid from the fluid outlet. The particle monitoring module may include a gas inlet coupled to the tank for supplying gas to the tank. The tank may be coupled to the fluid outlet through a first valve. The first LPC may be coupled to the tank through a second valve. The gas inlet may be coupled to the tank through a gas filter and a third valve. The particle monitor module may further include a fourth valve configured to control gas exiting from the tank. The particle monitor module may further include a pressure gauge coupled to the tank for monitoring gas pressure in the tank. The particle monitor module may further include a second LPC coupled to the fluid inlet for monitoring particles in the fluid coming to the fluid inlet. The second LPC may be coupled to the fluid inlet through a fifth valve. The system may further include a data processing module designed for collecting data from the particle monitor module; analyzing the data for particle result; and distributing the particle result. The distributing of the particle data may include sending out warning information. The tank may include a material selected from the group consisting of Polytetrafluorethylene, quartz, glass, metal, and combinations thereof.

The present disclosure also provides an immersion lithography system. The system includes an imaging system; a substrate stage positioned underlying the imaging system; an immersion fluid retaining structure configured to hold a fluid at least partially filling a space between the imaging system and a substrate on the substrate stage; a tank coupled to the immersion fluid retaining structure for taking the fluid; a liquid particle counter coupled to the tank for monitoring particles in the fluid; and a gas filter coupled to the tank for providing gas to the tank.

The disclosed system may further include a first valve configured between the tank and the immersion fluid retaining structure; a second valve configured between the tank and the liquid particle counter; and a third valve configured between the gas filter and the tank. The system may also further include a controller designed for controlling particle monitoring process, colleting particle data from the liquid particle counter, and processing the particle data.

The present disclosure also provides a method for immersion photolithography patterning. The method includes flowing an immersion fluid to a space between an imaging lens and a substrate on a substrate stage, through an immersion fluid retaining module; and monitoring particles in the immersion fluid flowing out from the space using a tank and a first liquid particle counter.

In the method, the monitoring particles may further include opening a first valve coupled between the tank and an immersion fluid outlet of the immersion fluid retaining module, for filling the immersion fluid into the tank from the space; closing the first valve after filling the tank with the immersion fluid; opening a second valve coupled between a gas filter and the tank, for providing a gas to the tank; maintaining the tank with the immersion fluid for a period of duration; and opening a third valve coupled between the tank and the first liquid particle counter, for flowing the immersion fluid through the first liquid particle counter and measuring the particle in the immersion fluid. The monitoring particles may further include a purging process. The monitoring particles may further include opening a fourth valve coupled between the tank and an immersion fluid outlet of the immersion fluid retaining module, for filling the immersion fluid into the tank from the space; and closing the fourth valve after filling the tank with the immersion fluid. The opening of the second valve may include supplying a gas selected from the group consisting of nitrogen gas, clean dry air, other inert gas, and combinations thereof, through the filter. The supplying a gas may include providing a positive pressure to the tank. The method may further include monitoring particles in the immersion fluid before flowing into the space, using a second liquid particle counter. The method may further include illuminating the imaging lens to perform a lithographic exposing process on the substrate. The method may further include collecting data from the first liquid particle counter; analyzing the data to provide particle result; and distributing the particle result. The distributing the particle result may include providing warning information to a user according to the particle result. The collecting data may include storing the data into a database.

Although embodiments of the present disclosure have been described in detail, those skilled in the art should understand that they can make various changes, substitutions and alterations herein without departing from the spirit and scope of the present disclosure.

What is claimed is:

1. An immersion lithography system, comprising:
    an imaging lens having a front surface;
    a substrate stage positioned under the front surface of the imaging lens;
    an immersion fluid retaining structure having at least one fluid port, configured to hold a fluid from the fluid port for at least partially filling a space between the front surface and a substrate on the substrate stage, and receive or dispel the fluid through the fluid port, wherein the fluid port is a fluid outlet; and
    a particle monitor module integrated with the immersion fluid retaining structure, wherein the particle monitor module comprises a first liquid particle counter (LPC) coupled to the fluid outlet for monitoring particles in the fluid flowing out of the fluid outlet and the particle monitor module is operable to count particles and determine particle size using light scattering.

2. An immersion lithography system, comprising:
    an imaging lens having a front surface;
    a substrate stage positioned under the front surface of the imaging lens;
    an immersion fluid retaining structure having at least one fluid port, configured to hold a fluid from the fluid port for at least partially filling a space between the front surface and a substrate on the substrate stage, and receive or dispel the fluid through the fluid port; and
    a particle monitor module integrated with the immersion fluid retaining structure, wherein the particle monitor module is operable to count particles and determine particle size using light scattering;
    a tank coupled to the fluid port for receiving the fluid, wherein the tank is configured to have a volume ranging between about 200 cc and about 600 cc for holding the received fluid;
    a first liquid particle counter coupled to the tank for monitoring particles in the received fluid; and
    a gas inlet coupled to the tank for supplying gas to the tank.

3. The system of claim 2, wherein the fluid port is a fluid inlet, and the particle monitor module comprises a second liquid particle counter coupled to the fluid inlet for monitoring particles in the fluid coming to the fluid inlet.

4. The system of claim 1, wherein the fluid port comprises a fluid inlet and a fluid outlet, the particle monitor module further comprises a first liquid particle counter and a second liquid particle counter, the fluid outlet is coupled to the first liquid particle counter for monitoring particles in the fluid flowing out the fluid outlet, the fluid inlet is coupled to the second liquid particle counter for monitoring particles in the fluid coming to the fluid inlet.

5. The system of claim 1, further comprising:
    a data processing module configured for collecting data from the particle monitor module, analyzing the data for particle result and distributing the particle result.

6. The system of claim 5, wherein the distributing of the particle data comprises sending out warning information.

7. An immersion lithography system, comprising:
    an imaging system;
    a substrate stage positioned underlying the imaging system;
    an immersion fluid retaining structure configured to hold a fluid at least partially filling a space between the imaging system and a substrate on the substrate stage;
    a tank coupled to the immersion fluid retaining structure for receiving the fluid;
    a liquid particle counter coupled to the tank for monitoring particles in the fluid; and
    a gas filter coupled to the tank for providing gas to the tank for use with the liquid particle counter.

8. The system of claim 7, further comprising:
    a first valve configured between the tank and the immersion fluid retaining structure;
    a second valve configured between the tank and the liquid particle counter; and
    a third valve configured between the gas filter and the tank.

9. The system of claim 7, further comprising:
    a controller designed for controlling particle monitoring process, colleting particle data from the liquid particle counter, and processing the particle data.

10. A method for immersion photolithography patterning semiconductor integrated circuits, comprising:
    flowing an immersion fluid to a space between an imaging lens and a substrate on a substrate stage, through an immersion fluid retaining module; and
    monitoring particles in the immersion fluid before flowing into the space and after flowing out from the space, utilizing a first liquid particle monitor configured to count particles and determine particle size before flowing into the space and a second liquid particle monitor configured to count particles and determine particle size after flowing out from the space.

11. The method of claim 10, wherein monitoring particles in the immersion fluid flowing out from the space utilizes a first liquid particle counter with a light scattering technique.

12. The method of claim 10, wherein monitoring particles in the immersion fluid before flowing into the space utilizes a second liquid particle counter.

13. A method for immersion photolithography patterning semiconductor integrated circuits, comprising:
    flowing an immersion fluid to a space between an imaging lens and a substrate on a substrate stage, through an immersion fluid retaining module; and monitoring particles in the immersion fluid before flowing into the space or after flowing out from the space, utilizing a first liquid particle counter configured to count particles and determine particle size;

opening a first valve coupled between a tank and an immersion fluid outlet of the immersion fluid retaining module, for filling the immersion fluid into the tank from the space;

closing the first valve after filling the tank with the immersion fluid;

opening a second valve coupled between a gas filter and the tank, for providing a gas to the tank;

maintaining the tank with the immersion fluid for a period of duration; and opening a third valve coupled between the tank and the first liquid particle counter for flowing the immersion fluid through the first liquid particle counter, and measuring the particle in the immersion fluid.

14. The method of claim 10, further comprising illuminating the imaging lens to perform a lithographic exposing process on the substrate.

15. The method of claim 10, further comprising:
collecting data from the first liquid particle counter;
analyzing the data to provide a particle result; and
distributing the particle result.

16. The method of claim 15, wherein the distributing the particle result comprises providing warning information to a user according to the particle result.

17. The method of claim 15, wherein the collecting data comprises storing the data into a database.

18. The method of claim 7, wherein the tank has a volume ranging from about 200 cc to about 600 cc.

19. The method of claim 7, wherein the tank comprises a material selected from the group consisting of polytetrafluorethylene (PTFE), quartz, glass, metal, and combinations thereof.

20. The method of claim 10, wherein the second liquid particle monitor monitors particles using a tank, and wherein the tank is filled with a gas by a gas filter before monitoring the particles.

* * * * *